US007849255B2

(12) United States Patent
Plessier et al.

(10) Patent No.: US 7,849,255 B2
(45) Date of Patent: Dec. 7, 2010

(54) PSEUDO-BIDIMENSIONAL RANDOMLY ACCESSIBLE MEMORY USING MONODIMENSIONAL SEQUENTIALLY-ACCESSIBLLE MEMORY STRUCTURE

(75) Inventors: Bernard Plessier, Singapore (SG); Ming Kiat Yap, Singapore (SG)

(73) Assignee: STMicroelectronics Asia Pacific Pte. Ltd., Singapore (SG)

( * ) Notice: Subject to any disclaimer, the term of this patent is extended or adjusted under 35 U.S.C. 154(b) by 458 days.

(21) Appl. No.: 10/662,225

(22) Filed: Sep. 12, 2003

(65) Prior Publication Data

US 2004/0115879 A1 Jun. 17, 2004

(30) Foreign Application Priority Data

Sep. 12, 2002 (EP) .................................. 02020689

(51) Int. Cl.
*G06F 12/00* (2006.01)
*G06F 13/00* (2006.01)

(52) U.S. Cl. ........................... 711/105; 711/104; 711/5; 711/157; 711/218; 711/219

(58) Field of Classification Search ....................... None
See application file for complete search history.

(56) References Cited

U.S. PATENT DOCUMENTS

| 3,967,263 | A | | 6/1976 | Chang et al. | |
|---|---|---|---|---|---|
| 4,656,625 | A | * | 4/1987 | Nojiri et al. | 370/267 |
| 5,805,821 | A | * | 9/1998 | Saxena et al. | 709/231 |
| 6,091,645 | A | | 7/2000 | Iadanza | |
| 6,118,298 | A | | 9/2000 | Bauer et al. | |
| 6,578,109 | B1 | * | 6/2003 | Stone et al. | 711/118 |
| 2002/0087817 | A1 | * | 7/2002 | Tomaiuolo et al. | 711/157 |
| 2005/0183091 | A1 | * | 8/2005 | Van Eijndhoven et al. | 719/312 |

FOREIGN PATENT DOCUMENTS

EP 0 295 751 A1 12/1988

OTHER PUBLICATIONS

European Search Report for EP 02 02 0689 dated May 28, 2003.

* cited by examiner

*Primary Examiner*—Mardochee Chery
(74) *Attorney, Agent, or Firm*—Lisa K. Jorgenson; Bryan A. Santarelli (57) ABSTRACT

A memory comprises at least one array of memory elements, a partition of the at least one array into a plurality of sub-arrays of the memory elements, and an array configuration circuit for selectively putting the at least one array in one of two operating configurations. In a first operating configuration, the memory elements of the at least one array are coupled one to another to form a monodimensional sequentially-accessible memory, while in a second operating configuration the memory elements in each sub-array are coupled to one another so as to form an independent monodimensional sequentially-accessible memory block, a data content of any memory element of the sub-array being rotatable by shifts through the memory elements of the sub-array. A sub-array selector, responsive to a first memory address, selects one among the at least two sub-arrays according to the first memory address, and enables access to the selected sub-array. A memory element access circuit, responsive to a second memory address, enables access to a prescribed memory element in the selected sub-array after a prescribed number of shifts of the data content of the memory elements in the selected sub-array depending on the second memory address.

17 Claims, 10 Drawing Sheets

PSEUDO-BIDIMENSIONAL RANDOMLY ACCESSIBLE MEMORY USING MONODIMENSIONAL SEQUENTIALLY-ACCESSIBLLE MEMORY STRUCTURE

The present application claims priority from European patent application no. 02020689.2, filed Sep. 12, 2002, which is incorporated herein by reference.

TECHNICAL FIELD

Embodiments of the present invention generally relate to data storage in integrated circuits.

BACKGROUND

Very often, data processing devices, such as microprocessors, microcontrollers, digital signal processors, coprocessors and the like, need a temporary data storage area for data processing. Conventionally, one or more memory blocks are provided, which can be instantiated by the IC designer.

Integrated circuit (IC) designers are normally faced with the problem of deciding whether to implement the memory block or blocks as First-In, First-Out (FIFO) memories, or to instantiate a Random Access Memory (RAM).

FIFO memories and RAMs have respective pros and cons.

As known, a FIFO memory includes a monodimensional array of memory elements, and can only be accessed sequentially in a first-in, first-out manner; in other words, in a FIFO memory it is not possible to access randomly a generic memory element within the array. This may be a significant limitation. However, FIFO memories are capable of operating at high speeds (low access time), and are used as large data buffers.

On the contrary, a RAM is a bidimensional array of memory elements that can be accessed randomly, both in writing and in reading. However, RAMs often feature operating speeds slower than that of the FIFO memories.

In many cases, application constraints set a clear cut choice between a FIFO memory or a RAM. For example, if a block of memory elements is needed that are randomly accessible either in writing or in reading, and the operating speed requirements are not very strict, the IC designer can choose to instantiate a RAM; conversely, if the operating speed requirements cannot be satisfied by the available RAMs, and the applicative context does not compel randomly accessible memory elements, a FIFO memory is chosen.

Nevertheless, there are cases in which the choice is not straightforward. For example, it may be necessary to have a memory that is randomly accessible and at the same time features a high operating speed, higher than that achievable by the available RAM technology.

It has been found that in some applications a fully randomly accessible memory block is not really required. For example, it has been found that there are applications in which while the retrieval of data from the memory block needs to be random, the storage of data in the memory block may be sequential, or vice versa.

SUMMARY

Based on this insight, one embodiment of the present invention provides a memory architecture that enables a random access to the locations thereof in at least one among a data storage operating mode and a data retrieval operating mode, at the same time featuring a high operating speed.

Briefly stated, a memory according to this embodiment of the invention comprises:

at least one array of memory elements, a partition of the at least one array into a plurality of sub-arrays of the memory elements, and an array configuration circuit for selectively putting the at least one array in one of two operating configurations, including a first operating configuration, in which the memory elements of the at least one array are coupled one to another to form a monodimensional sequentially-accessible memory, and a second operating configuration, in which the memory elements in each sub-array are coupled to one another so as to form an independent monodimensional sequentially-accessible memory block, a data content of any memory element of the sub-array being rotatable through the memory elements of the sub-array.

A sub-array selector, responsive to a first memory address, selects one among the at least two sub-arrays according to the first memory address, enabling access to the selected sub-array.

A memory element access circuit, responsive to a second memory address, enables access to a prescribed memory element in the selected sub-array after a prescribed number of shifts, depending on the second memory address, of the data content of the memory elements in the selected sub-array.

BRIEF DESCRIPTION OF THE DRAWINGS

Features and advantages of the present invention will be made apparent by the following detailed description of an embodiment thereof, provided merely by way of non-limitative example, which will be made in connection with the annexed drawings, wherein.

DETAILED DESCRIPTION

Figure 1:
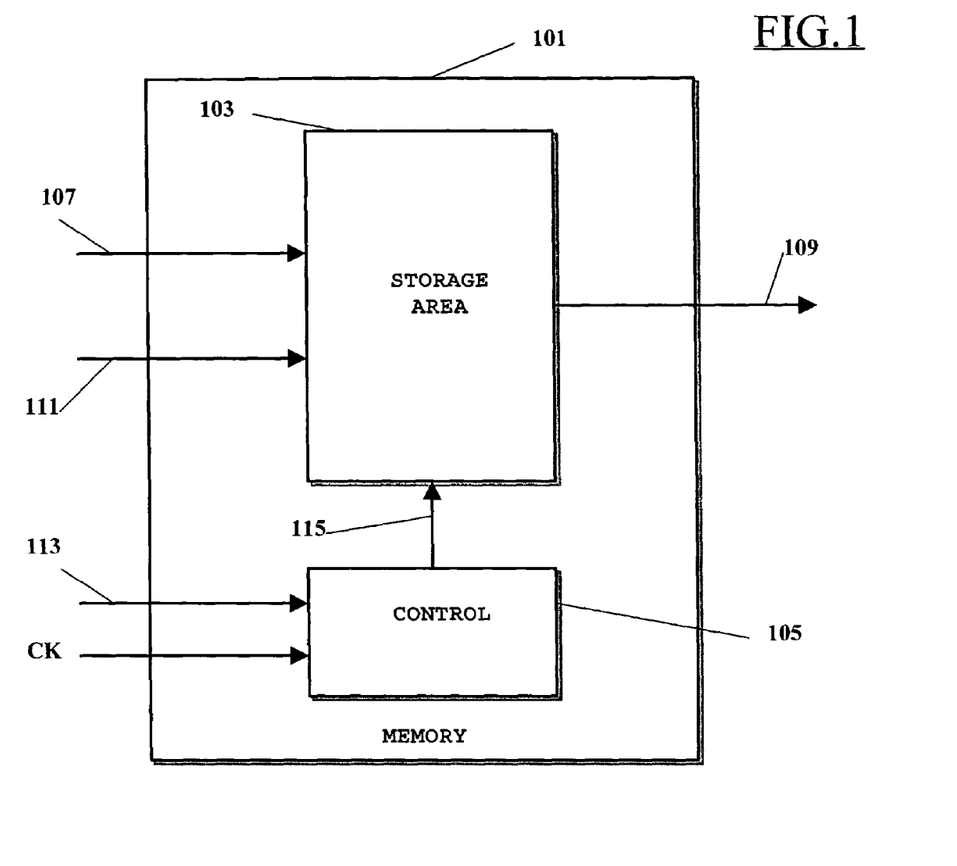
FIG. 1 is a schematic diagram of a memory according to an embodiment of the present invention.

With reference to the drawings, and particularly to FIG. 1, a memory according to an embodiment of the present invention is schematically shown. In extremely general terms the memory, identified globally by 101, includes a data storage area, depicted schematically as a block identified by 103, and a memory control unit 105 controlling the operation of the data storage area 103.

The data storage area 103 is accessed for storage and retrieval of data. In particular, the data storage area receives input data 107 to be stored therein, provides output data 109 retrieved therefrom, and receives an address 111 identifying from where, within the data storage area 103, the output data 109 are to be retrieved.

The memory control unit 105 receives commands 113 for controlling the memory operation, and a clock signal CK setting the timing of the memory operation; the commands 113 include in particular commands for determining the type of access that is required to the data storage area 103, i.e., a data storage or a data retrieval access. The memory control unit 105 outputs control signals, globally identified by 115, for the data storage area 103. The memory control unit 105 may for example include a state machine, clocked by the clock signal CK or by a signal derived therefrom.

The memory 101 may for example be associated with a microprocessor, a microcontroller or, in general, any data processing device, such as a digital signal processor, a coprocessor and the like, that, in operation, needs to access a data storage for both storing and retrieving data. In particular, the memory 101 is integrated in the same chip as the data processing device, or the memory 101 is a stand-alone unit, integrated in a distinct chip.

Figure 2A:
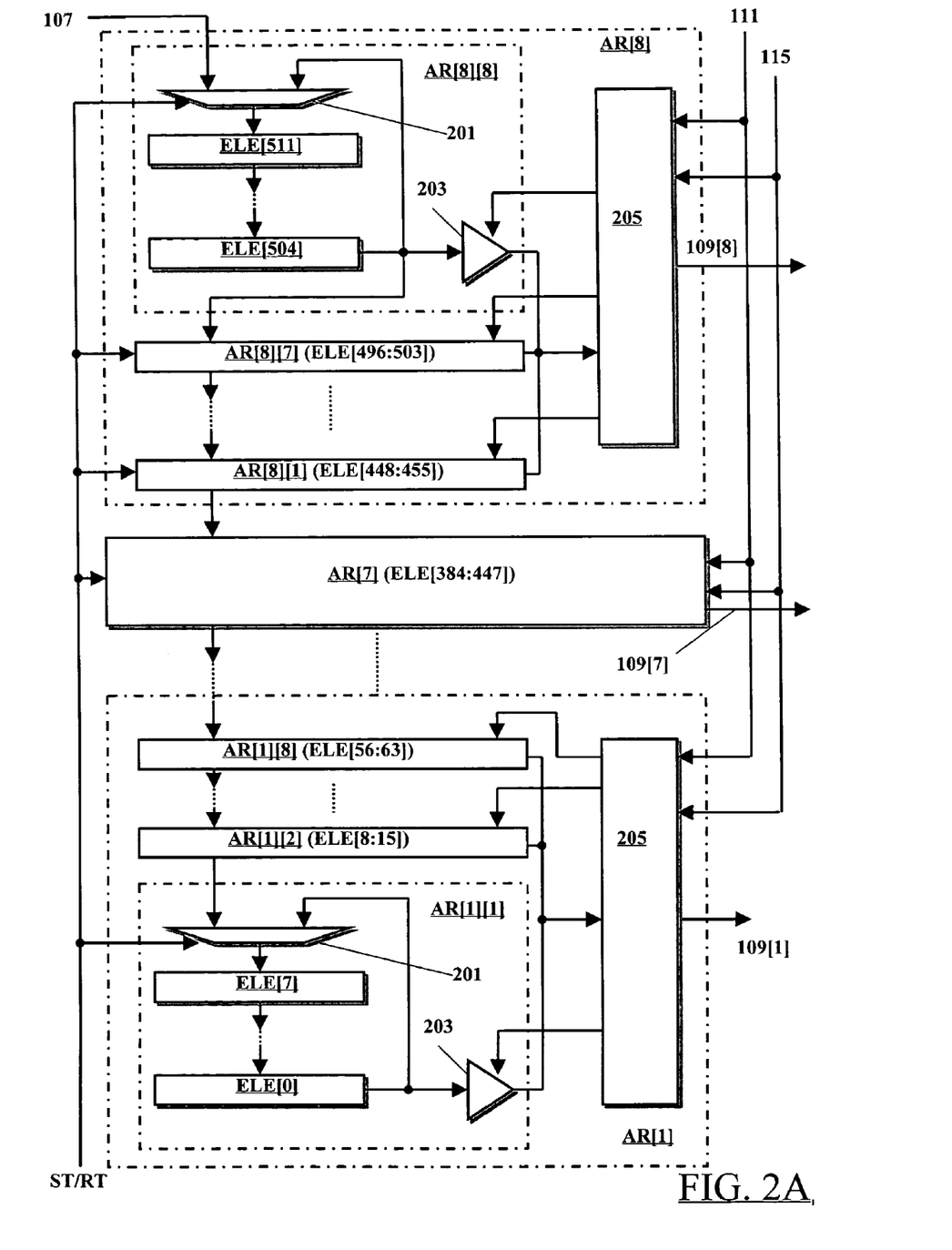
FIG. 2A shows the structure of the memory of FIG. 1 in greater detail according to an embodiment of the invention.

FIG. 2A shows in greater detail the data storage area 103, in one embodiment of the present invention. The data storage area 103 comprises a plurality of monodimensional arrays AR[1]-AR[8] of memory elements ELE[0]-ELE[511]. In particular, in the exemplary embodiment of the invention described herein, the number of arrays AR[1]-AR[8] is equal to eight, and each array contains sixty-four memory elements, each having a width of four bits; the data storage area 103 consequently comprises a total of 512 memory elements of four bits each. Clearly, the number of arrays, the number of memory elements in the arrays and the width of the memory elements may vary, and are not limitative to the present invention.

Figure 2B:
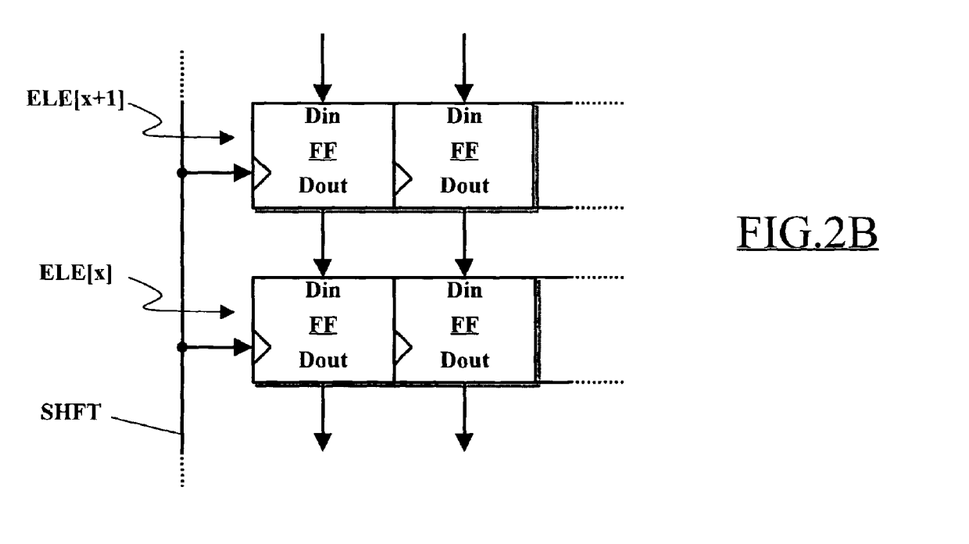
FIG. 2B schematically shows the structure of memory elements of the memory of FIG. 1 according to an embodiment of the invention.

As shown in FIG. 2B, wherein two generic adjacent memory elements ELE[x], ELE[x+1] are shown, the memory elements ELE[0]-ELE[511] are of the type used in sequentially-accessible memories such as FIFO memories. In particular, and by way of example, the 512 four-bit memory elements form altogether a shift register of 512 stages of four bits each; each bit of each shift register stage is for example comprised of a flip-flop FF. A flip-flop data input Din is connected to a flip-flop data output Dout of the corresponding flip-flop of the previous adjacent memory element. A shift control signal SHFT, part of the of the control signals 115 outputted by the memory control unit 105, commands the shifting of the data content from one memory element to another, in the way to be described in detail in the following.

Each array AR[1]-AR[8] is partitioned into a plurality of sub-arrays; in particular, in the exemplary embodiment of the invention described herein, each array AR[1]-AR[8] is partitioned into eight sub-arrays, each one containing eight memory elements. For simplicity of the drawing, in FIG. 2A only three sub-arrays AR[1][1], AR[1][2] and AR[1][8] of the array AR[1], and three sub-arrays AR[8][1], AR[8][7] and AR[8][8] of the array AR[8] are explicitly shown.

FIG. 2A also shows an exploded view of two sub-arrays of the plurality of sub-arrays, namely the sub-array AR[1][1] of the array AR[1] and the sub-array AR[8][8] of the array AR[8]. In particular, each sub-array of the arrays AR[1]-AR[8] has the structure of a sequentially-accessible memory, e.g. a FIFO memory with (in the example here considered) eight FIFO memory locations, represented by the memory elements of the sub-array (e.g., the memory elements ELE[0:7] in the sub-array AR[1][1], the memory elements ELE[8:15] in the sub-array AR[1][2] etc.). Within each sub-array, the memory elements are cascaded with each other. An exception being made for the uppermost memory element of the sub-array (in the example, the memory element ELE[7] in the sub-array AR[1][1], the memory element ELE[15] in the sub-array AR[1][2] and so on, till the memory element ELE[511] in the sub-array AR[8][8]), each memory element in any sub-array has an input connected to an output of the previous adjacent memory element of the sub-array, so as to be capable of receiving the data content thereof. The uppermost memory element in each sub-array has an input fed by an output of a respective multiplexer 201 that has a first input connected to an output of the lowest memory element of the previous adjacent sub-array, or to the memory input data 107 in the case of the uppermost sub-array AR[8][8], and a second input connected to an output of the lowermost memory element of the same sub-array. The multiplexers 201, one for each sub-array, are controlled by a control signal ST/RT (storage/retrieval), part of the control signals 115 outputted by the memory control unit 105. The storage/retrieval control signal ST/RT is for example asserted when the memory 101 operates in data storage mode, and deasserted when the memory operates in data retrieval mode.

Figure 3:
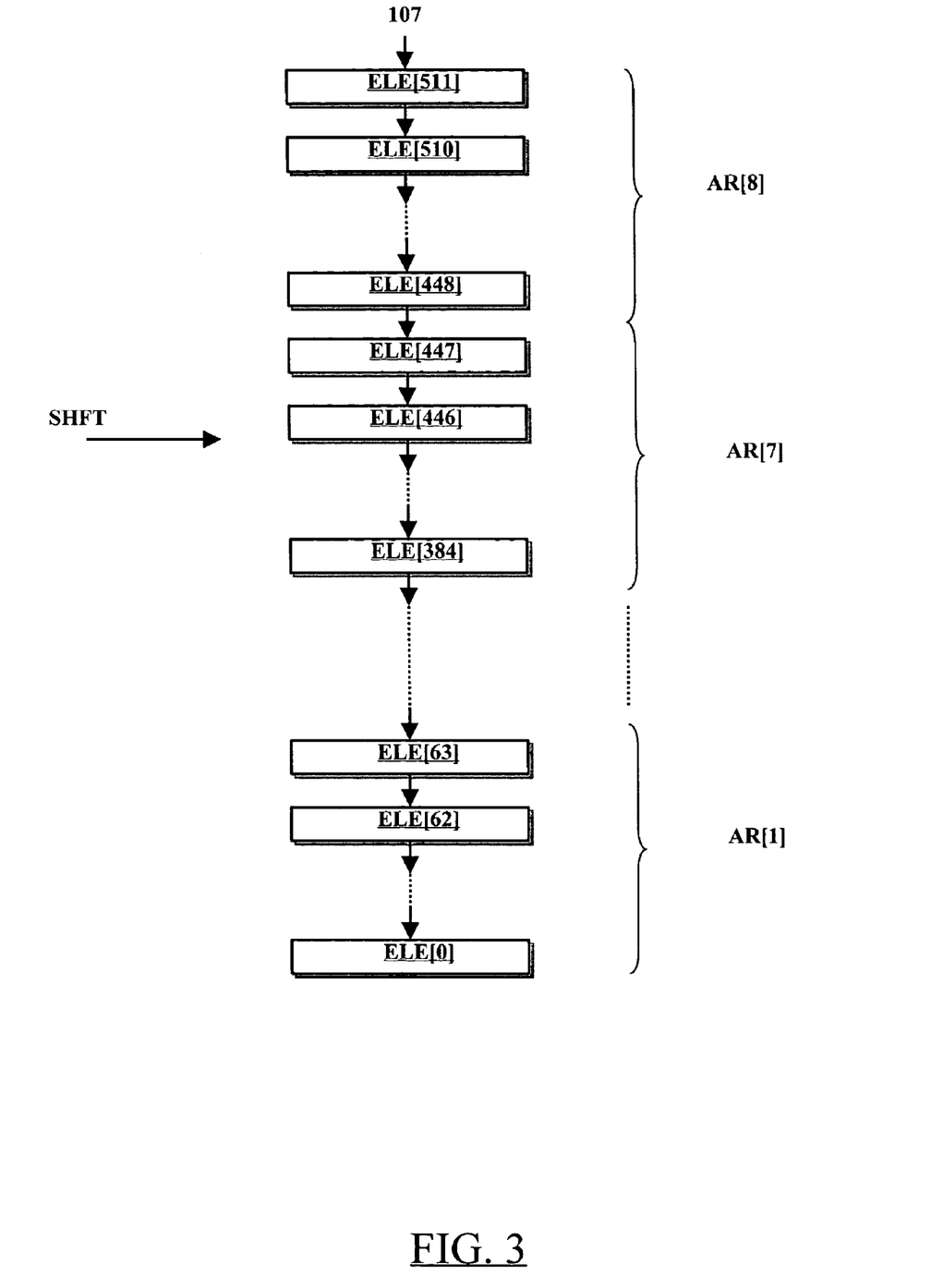
FIG. 3 schematically shows an internal configuration of the memory of FIG. 1 in a first operating condition, particularly a data storage operating condition according to an embodiment of the invention.

When the storage/retrieval control signal ST/RT is asserted (data storage operating mode), the multiplexers 201 are all switched so that the uppermost memory element ELE[511] in the sub-array AR[8][8] can receive the memory input data 107, and the uppermost memory elements in the remaining sub-arrays can each receive the data content of the lowest memory element in the previous adjacent sub-array. In this condition, the memory elements in all the arrays and sub-arrays are so linked to form at all effects a sequentially-accessible memory, e.g. a FIFO memory with 512 memory locations, as schematically shown in FIG. 3. The shift control signal SHFT commands the shifting of the data content of the uppermost memory element ELE[511] all the way down to the lowest memory element ELE[0].

When, on the contrary, the storage/retrieval control signal ST/RT is deasserted (data retrieval operating mode), the multiplexers 201 are all switched so that the uppermost memory element in each sub-array can receive the data content of the lowest memory element of the same sub-array, and the sub-arrays are isolated from one another. In this condition, schematically shown in FIG. 4, the memory elements are so linked to form a plurality of independent shift-and-rotate memory blocks or units, each made up of eight memory elements. In each shift-and-rotate unit, the shift control signal SHFT commands the shift and rotation of the data content of the uppermost memory element down to the respective lowest memory element, and up again to the uppermost memory element. In other words, within each sub-array the data content of a generic memory element of the sub-array can be rotated through all the memory elements of the sub-array.

Reverting to FIG. 2A, the output of the lowest memory element in each sub-array is also fed to a respective tristate buffer 203, controlled by a respective array control circuit 205. One array control circuit 205 is provided in each array AR[1]-AR[8], all the tristate buffers in the sub-arrays that make up a generic array being controlled by a same respective array control circuit. In particular, within each array AR[1]-AR[8], the array control circuit 205 selectively enables one of the eight tristate buffers 203 to output the data received from the respective memory element, while the remaining seven tristate buffers are left in a high output impedance condition. The outputs of the eight tristate buffers 203 in each array AR[1]-AR[8] are wired together and fed to the respective array control circuit 205. The array control circuit 205 controls the tristate buffers on the basis of the memory address 111. Each array control circuit 205 also receives the control signals 115, and outputs a respective portion 107[1]-107[8] of the memory output data 109.

Figure 5:
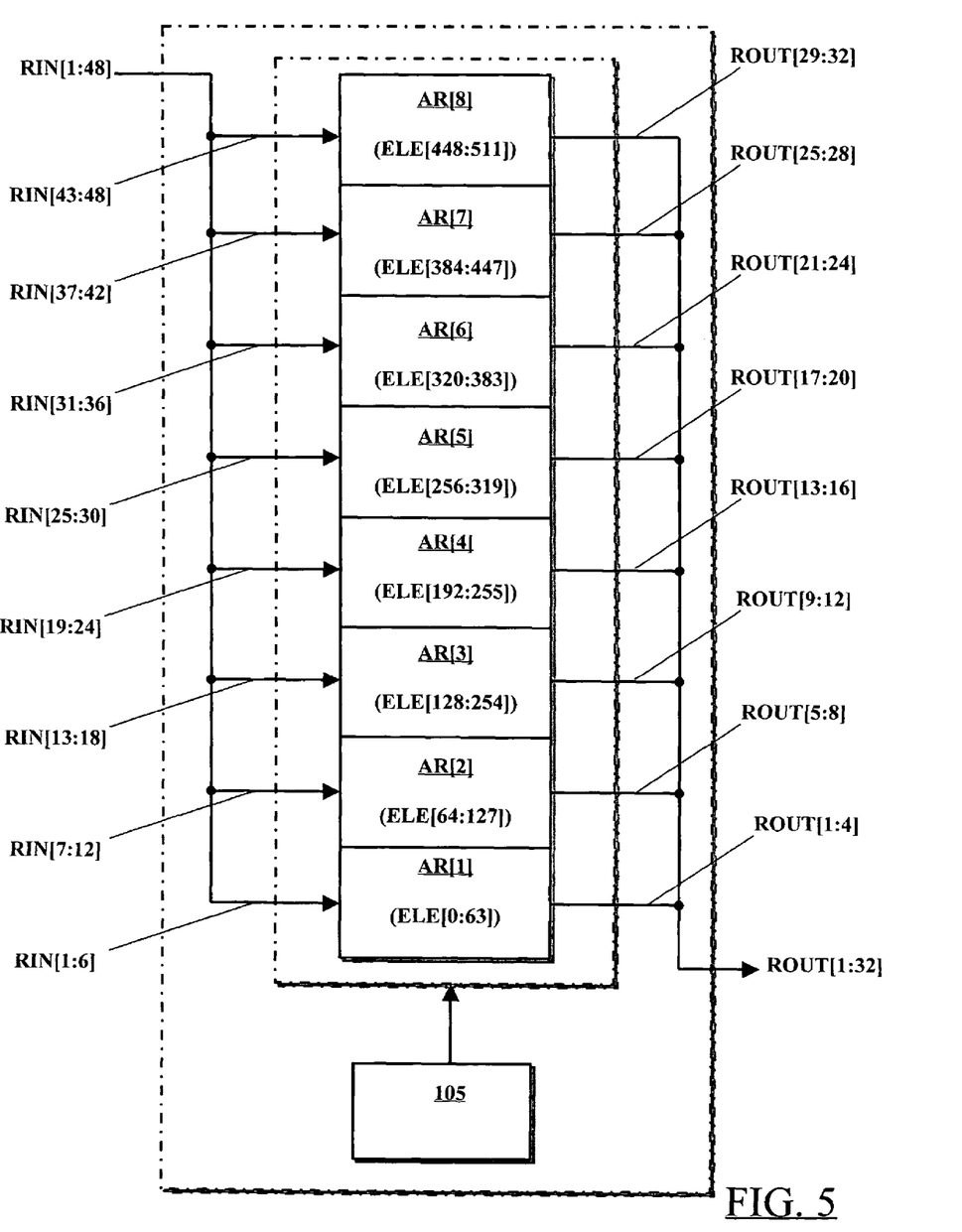
FIG. 5 schematically shows the memory of FIG. 1 in a data retrieve operation according to an embodiment of the invention.

In the exemplary embodiment of the invention described herein, not at all limitative, the memory 101 is conceived to be used as a look-up table. As schematically shown in FIG. 5, when the memory is accessed for retrieving data stored therein, an input word RIN[1:48], in this example a word of forty-eight bits, is fed as an address to the memory 101 for accessing specific memory elements in the storage area 103. In response, the memory provides an output data word ROUT [1:32], which in the shown example is a word of thirty-two bits.

The input word RIN[1:48] is split into a number of different input sub-words RIN[1:6], RIN[7:12], RIN[13:18], RIN [19:24], RIN[25:30], RIN[31:36], RIN[37:42] and RIN[43:48] equal to the number of sub-arrays AR[1] to AR[8]. In the exemplary embodiment of the invention described herein, the input word RIN[1:48] of forty-eight bits is split into eight sub-words, each one including six bits.

Each sub-array AR[1] to AR[8] provides a respective output data sub-word ROUT[1:4], ROUT[5:8], ROUT[9:12], ROUT[13:16], ROUT[17:20], ROUT[21:24], ROUT[25:28] and ROUT[29:32]; the output data sub-words form, altogether, the output data word ROUT[1:32]. In the exemplary embodiment described herein, eight output data sub-words of four bits each are provided.

Figure 6:
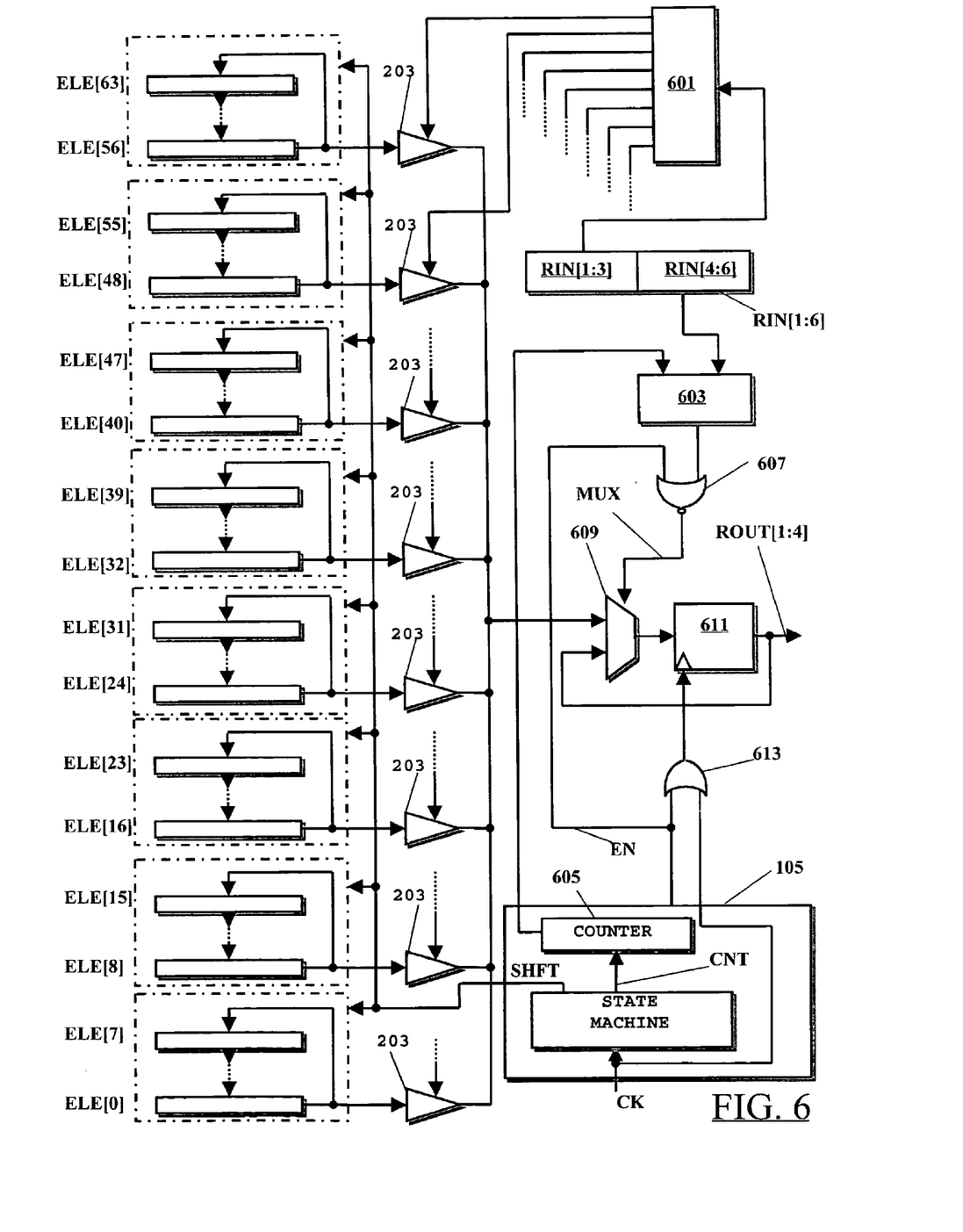
FIG. 6 shows in detail one of a plurality of memory array control circuits for controlling the data retrieval from a respective portion of the memory according to an embodiment of the present invention.

Reference is now made to FIG. 6, showing in greater detail the structure of one of the array control circuits 205, namely the array control circuit in the array AR[1]. A decoder 601 receives a portion (i.e., a group of bits, in the example three) RIN[1:3] of the input sub-word RIN[1:6] which is fed to the array AR[1]. The decoder 601 decodes the digital code carried by the three bits RIN[1:3] and accordingly enables one of the eight tristate buffers 203. The remaining three bits RIN [4:6] of the input sub-word RIN[1:3] are fed to a comparator 603. The comparator 603 compares the binary value carried by the three bits RIN[4:6] to a value of a three bit counter 605 in the memory control unit 105. An output of the comparator 603, which is asserted (low logic state) when coincidence is detected between the binary value carried by the three bits RIN[4:6] and the value of the counter 605, is fed to an input of a two-inputs NOR logic gate 607. The other input of the NOR gate 607 is fed with an enable signal EN, part of the control signals 115 generated by the memory control unit 105; the enable signal EN, common to all the arrays AR[1]-AR[8], is asserted low for enabling retrieval of data from the memory. An output MUX of the NOR gate 607 controls a two-input multiplexer 609. A first input of the multiplexer 609 receives the outputs of the tristate buffers 203. An output of the multiplexer 609 feeds a data input of a register 611 (e.g., made up of a prescribed number of flip-flops, four in the present example), clocked to load data by a register clock signal which is a logic OR (OR logic gate 613) of the clock signal CK and the enable signal EN. A register data output forms the output data sub-word ROUT[1:4] of the array AR[1], and is additionally routed back to the second input of the multiplexer 609.

The operation of the memory 101 will be hereinbelow described, considering firstly a data retrieval operation, and then a data storage operation.

Data Retrieval

When specific commands 113 are received, indicating that an external device, such as a microprocessor, a microcontroller or any data processing unit, needs to access the memory 101 for retrieving data stored therein, the memory 101 enters the data retrieval operating mode. The memory control unit 105 deasserts the storage/retrieval control signal ST/RT, thereby the multiplexers 201 are switched so as to put the memory in the configuration schematically shown in FIG. 4.

Referring to FIG. 5, the input word RIN[1:48] that is fed to the memory 101 as a memory access key for retrieving the desired data is split into the eight input sub-words RIN[1:6], RIN[7:12], RIN[13:18], RIN[19:24], RIN[25:30], RIN[31:36], RIN[37:42] and RIN[43:48], each of which is fed to the array control circuit 205 of a respective array AR[1]-AR[8].

The first three bits of each input sub-word RIN[1:6], RIN [7:12], RIN[13:18], RIN[19:24], RIN[25:30], RIN[31:36], RIN[37:42] and RIN[43:48] feed the decoder 601 in the respective array control circuit. Depending on the digital code carried by the first three bits of each input sub-word, one of the eight tristate buffers 203 in each array AR[1]-AR[8] is enabled, while the remaining seven tristate buffers are kept in a high output impedance condition. Thus, the first three bits of each input sub-word select one sub-array within each array AR[1]-AR[8].

The remaining three bits of each input sub-word RIN[1:6], RIN[7:12], RIN[13:18], RIN[19:24], RIN[25:30], RIN[31:36], RIN[37:42] and RIN[43:48] are instead fed to the respective comparator 603.

The memory control unit 105 asserts the enable signal EN, and starts clocking the counter 605, through a counter clock signal CNT. With the enable signal EN asserted, the clock pulses of the clock signal CK are made visible to the clock input of the registers 611, which consequently load, at each clock pulse, the data present at the respective data inputs, i.e., at the output of the respective multiplexers 609. The assertion of the enable signal EN also entrust the control of the multiplexers 609 to the respective comparators 603.

Figure 4:
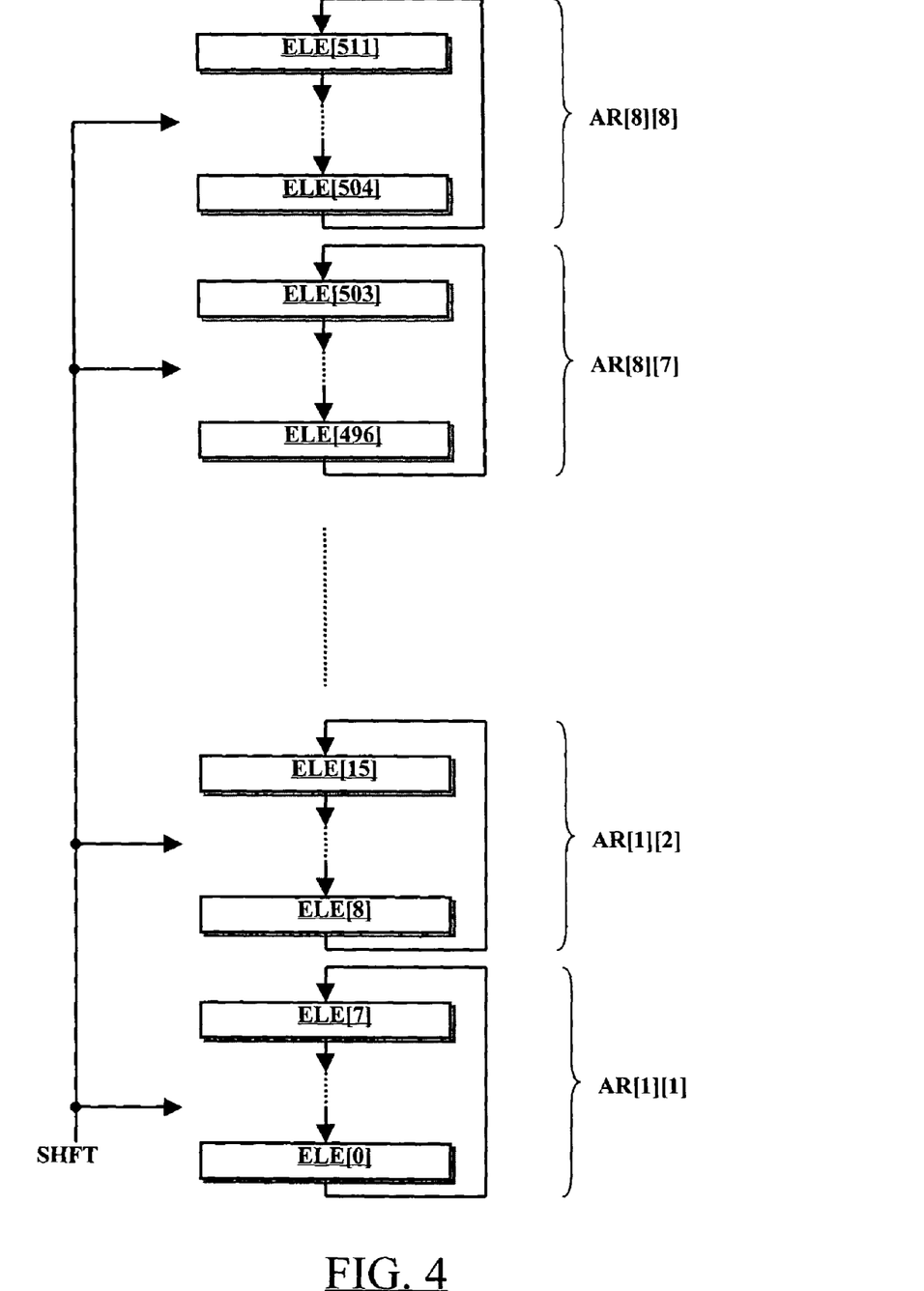
FIG. 4 schematically shows an internal configuration of the memory of FIG. 1 in a second operating condition, particularly a data retrieve operating condition according to an embodiment of the invention.
Figure 7A:
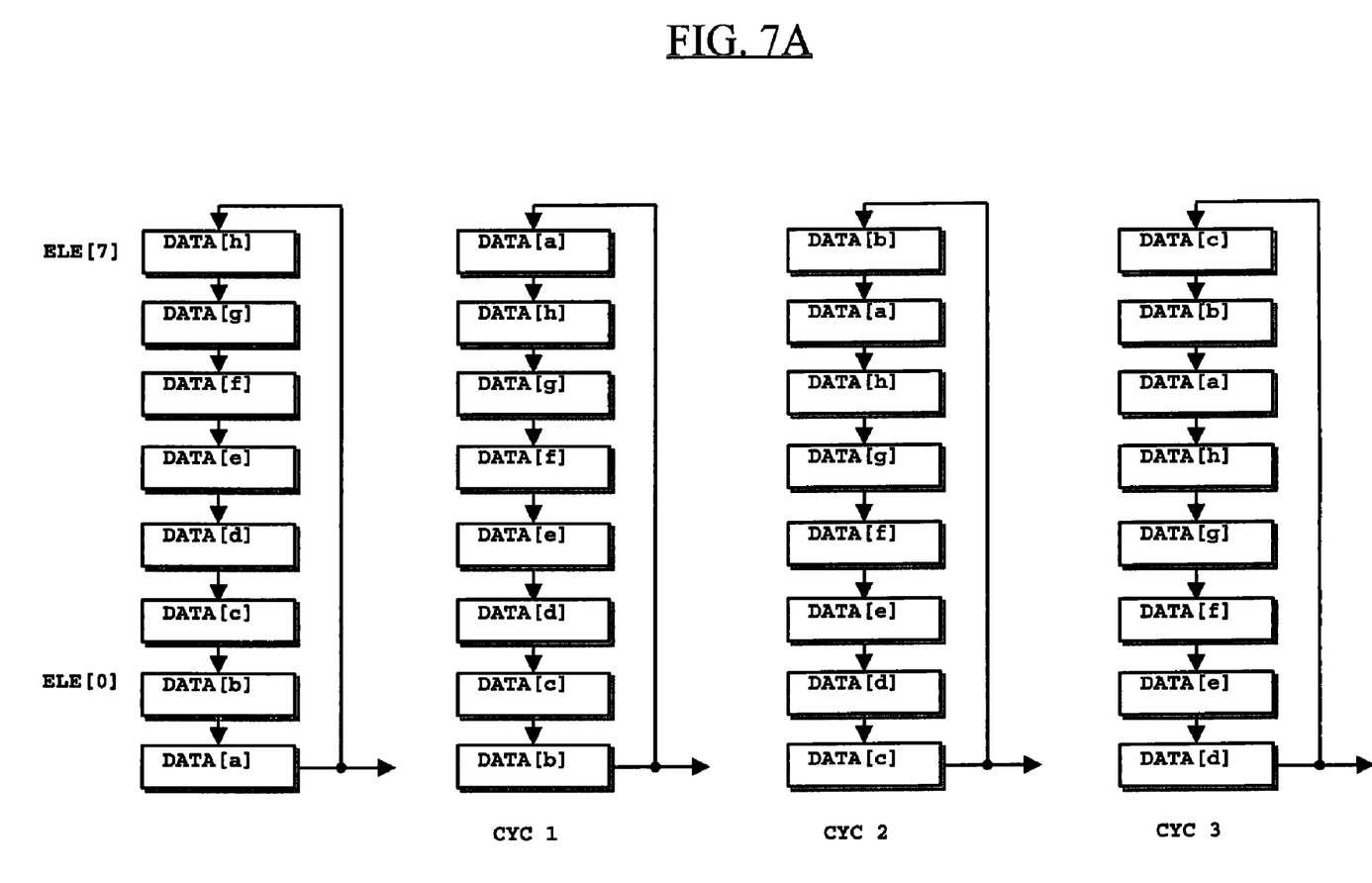
FIGS. 7A and 7B pictorially show the internal behavior of the memory during a data retrieval operation according to an embodiment of the invention.
Figure 7B:
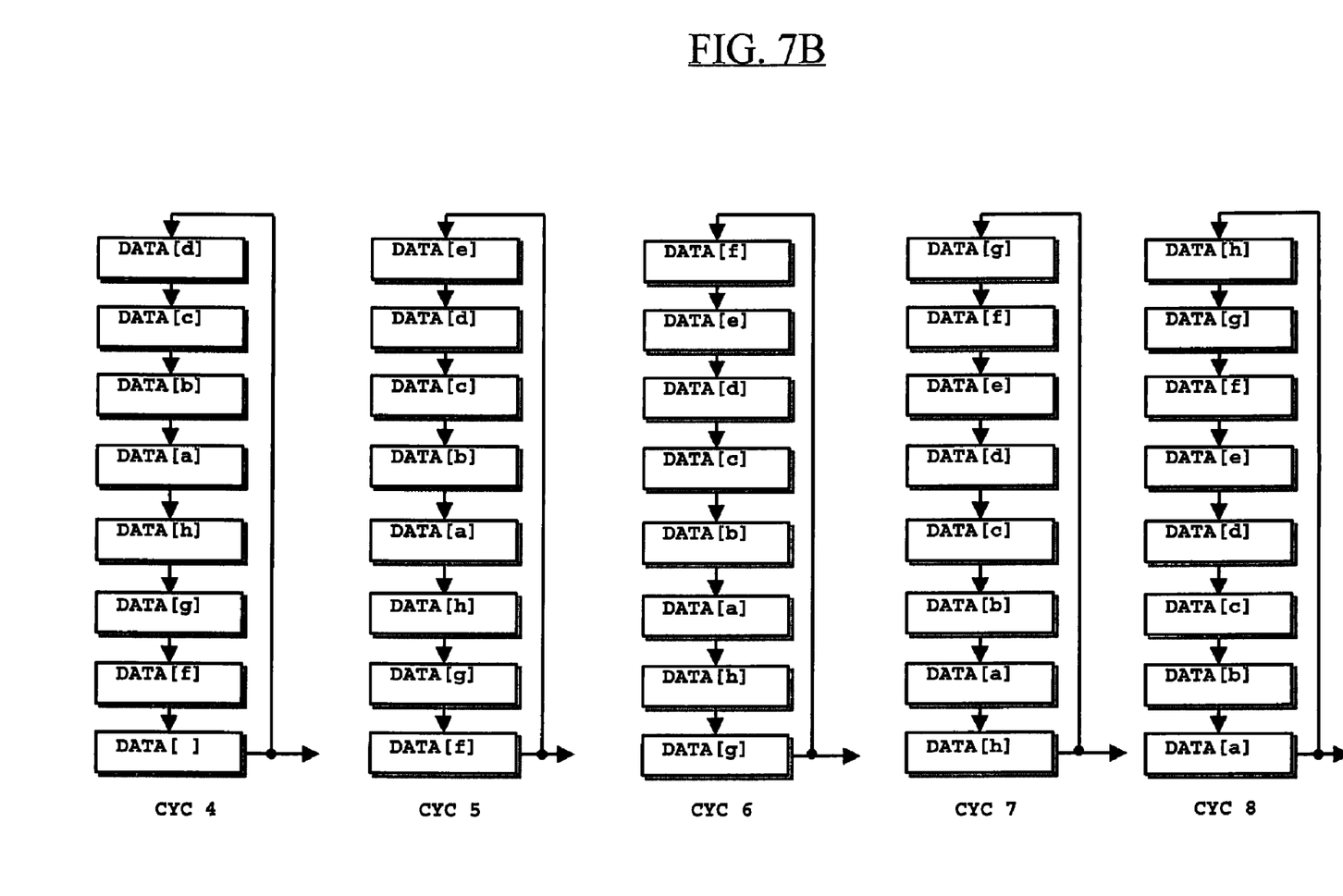
Figure 8:
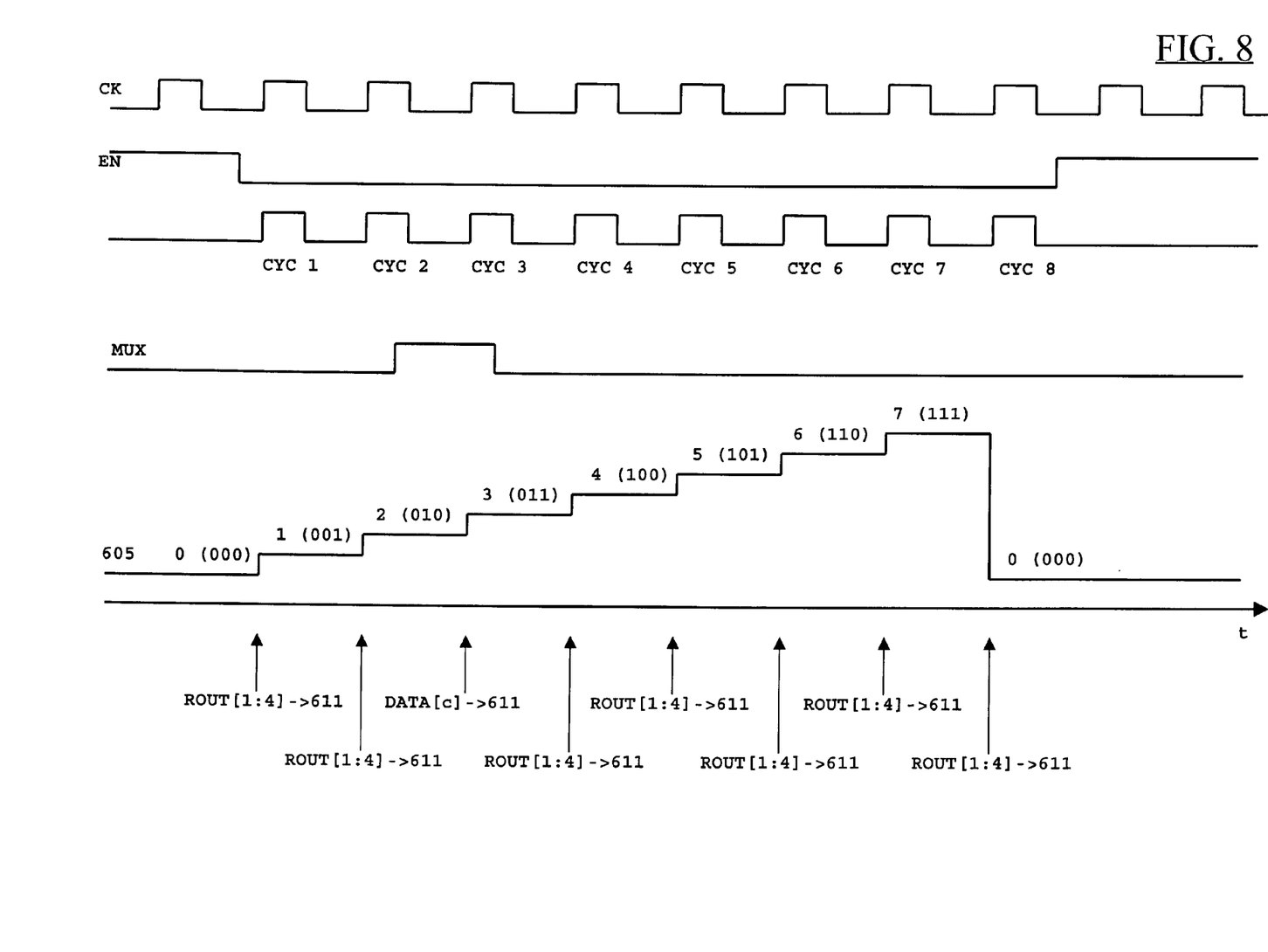
FIG. 8 is a simplified time diagram of a data retrieve operation according to an embodiment of the invention.

In addition to clocking the counter 605, the memory control unit 105 clocks the shift-and-rotate memory units schematically shown in FIG. 4, by means of the shift control signal SHFT. The behaviour is schematically shown in FIGS. 7A and 7B in connection with the shift-and-rotate memory unit formed by the memory elements ELE[0] to ELE[7] of the first sub-array AR[1][1] in the array AR[1], while FIG. 8 shows the timing of the data retrieval operation. DATA[a] to DATA [h] identify data respectively stored in the memory elements ELE[0] to ELE[7] before the start of the data retrieval operation.

The counter 605 is initially at 0 ("000"), and the enable signal EN is deasserted. When the signal is asserted, the clock signal CK is made visible to the clock input of the registers 611. At the first clock cycle (CYC1), the counter 605 switches to 1 ("001"). The counter value is compared to the three bits RIN[4:6]: since no coincidence is detected, the register 611 in the array control circuit 205 of the array AR[1] is loaded with the data present at the register data output, i.e., the register is not updated.

When, at the second clock cycle CYC 2 the counter reaches the value 2 ("010"), the comparator detects the coincidence with the value of the three bits RIN[4:6] and switches the multiplexer 609. In this way, the data input of the register 611 is connected to the output of the enabled tristate buffer 203. At the next clock cycle, the data DATA[c] present at the output of the enabled tristate buffer 203 is loaded into the register 611. From now on, for the remaining clock cycles, the register 611 is no longer updated, because the comparator detects no more coincidence between the counter value and the value of the three bits RIN[4:6]. The register 611 is re-loaded with the data already stored therein.

After eight clock cycles, the clocking of the counter and of the shift-and-rotate memory units is stopped and the enable signal EN is deasserted.

The same occurs in the remaining seven arrays AR[2]-AR [8]. In each array, the clock cycle at which the respective register 611 is updated with the data content of a memory element of the selected sub-array depends on the three bits RIN[1:6], RIN[7:12], RIN[13:18], RIN[19:24], RIN[25:30], RIN[31:36], RIN[37:42] and RIN[43:48] of the respective input sub-word.

In other words, in each sub-array a prescribed memory element is chosen as an output port, and feeds the respective tristate buffer. The first three-bit portion of the input sub-word to each array determines which sub-array in each array is selected. The data content of the memory elements in the selected sub-array is then rotated through the elements of the sub-array, and when the data content of the desired memory element of the sub-array (determined by the remaining three bits of the respective input sub-word) reaches the memory element chosen to act as the output port, it is loaded into the register 611 and made available at the outside of the memory.

It can be appreciated that a total of eight clock cycles are required for having the requested data available at the outputs ROUT[1:4] to ROUT[29:32] of the registers 611 in the eight arrays AR[1]-AR[8], i.e., at the output data word ROUT[1:32] of the memory 101; in a ninth clock cycle, the output data word ROUT[1:32] of the memory is transferred to the data processing device. It can also be appreciated that, at the end of the data retrieval phase, the data content of the 512 memory elements of the memory coincide with the data content before the data retrieval.

The number of clock cycles would be the same if a RAM were used: also in this case, nine clock cycles would still be required in order to select the memory elements one by one (only one output data sub-word can be read out of a RAM in one clock cycle, and it is available at the next clock cycle after the address is put on the RAM address bus). Thus, the described pseudo-bidimensional memory architecture matches the performance of a RAM.

If instead a 512 elements FIFO memory were used, 512 clock cycles would be required to access a particular memory element (with the data contained in the lowest memory element of the FIFO memory routed back to the uppermost element).

The number of clock cycles required to provide the data varies depending on the number of memory elements in each sub-array, i.e., on the degree of partition of the monodimensional arrays of memory elements. Depending on the timing budget, the number of memory elements in the sub-arrays may be higher or lower. For example, sub-arrays of two, four, sixteen, thirty-two, sixty-four, one hundred and twenty eight or two hundred and fifty-six memory elements may be adopted.

Data Storage

Differently from the data retrieval operation, in which any memory element in each of the arrays AR[1] to AR[8] can be randomly accessed for retrieving the data contained therein, and the memory is seen from the outside as a bidimensional memory, the memory 101 operates as a sequentially-accessible memory when it has to be filled in with data.

The memory 101 enters the data storage operating mode upon receiving specific commands 113 from the data processing device with which it is associated. The memory control unit asserts the storage/retrieval control signal ST/RT, thereby the multiplexers 201 are all switched so as to put the memory in the configuration schematically shown in FIG. 3.

At each cycle of the clock signal CK, the data processing device supplies a four-bit data word to the memory 101, via the memory input data 107 The memory control circuit 105 clocks the shift control signal SHFT, so that at each clock cycle the data previously received are pushed one memory element down in the stack of 512 memory elements, and the newly received four-bit data word is stored in the uppermost memory element ELE[511] of the memory. At the end of the process, the first four-bit data word received is found in the lowest memory element ELE[0], and the last four-bit data word received is found in the uppermost memory element ELE[511].

Figure 9:
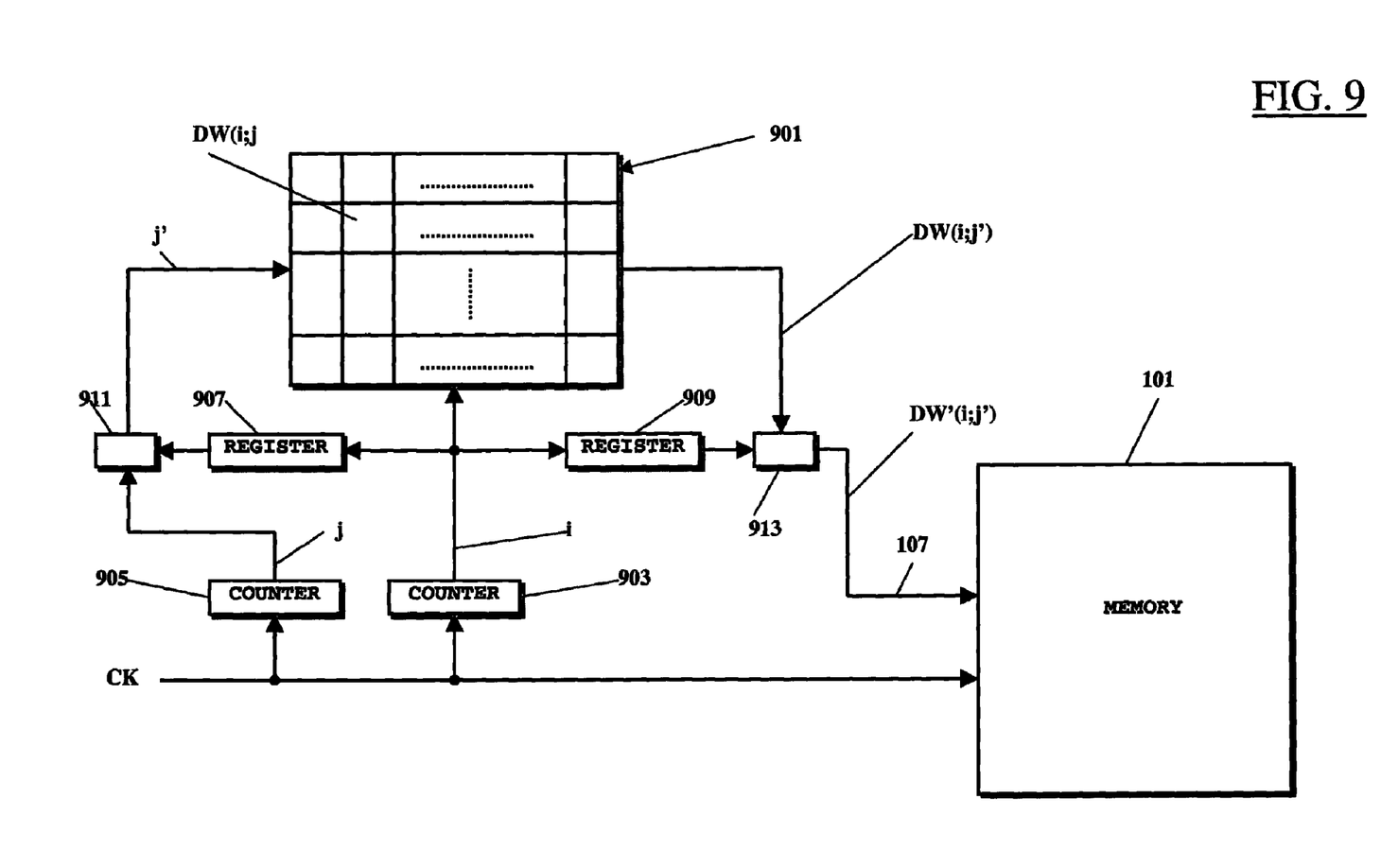
FIG. 9 schematically shows an arrangement for generating data to be stored in the memory according to an embodiment of the present invention.

Merely by way of non-limitative example, FIG. 9 schematically shows a possible arrangement adopted to store data in the memory 101 in the case in which the memory 101 is used to implement a look-up table storing a scrambled version of an original look-up table 901. The look-up table 901 may be implemented by means of a combinational circuit or a RAM.

In the present example, the original look-up table 901 contains 512 four-bit data words DW(i,j), arranged by sixty-four rows and eight columns. Two counters 903 and 905, clocked by the clock signal CK, are used to scan the entire look-up table 901; in particular, the counter 903, generating a three-bit digital code i, is used to scan the eight columns of the look-up table 901 (i=1 to 8), while the counter 905, generating a six-bit digital code j, is used to scan the rows a=0 to 63).

Two registers 907 and 909 store scrambling digital codes used in the scrambling process. The register 907 is made up of forty-eight bits, while the register 909 is made up of thirty-two bits.

A first logic circuit 911, for example comprising XOR logic gates, combines the six-bit digital code j generated by the counter 905 with a prescribed six-bit portion of the encryption code stored in the register 907, so as to generate a scrambled six-bit digital code j' selecting the row of the look-up table 901. The digital code j', together with the digital code i, selects an element DW(i,j') in the look-up table 901.

The selected four-bit element DW(i,j') is combined by a second logic circuit 913, comprising for example XOR logic gates, with a prescribed four-bit portion of the scrambling code stored in the register 909, to produce a scrambled version DW'(i,j') of the four-bit element DW(i,j'). Such a scrambled version DW'(i,j') is fed to the memory 101.

The arrangement depicted in FIG. 9 implements the following algorithm:

For i=1 to 8
For j=0 to 63

$$DW'[i,j']=DW[i,j] \text{ XOR } A1[(i-1)*6+1:i*6]] \text{ XOR } A2[(i-1)*4+1:i*4]$$

where A1 and A2 are the forty-eight bit and the thirty-two bit scrambling codes stored in the registers 907 and 909, respectively.

It can be appreciated that the memory 101, viewed from the outside, is seen, at least in data retrieval, as a two-dimensional array of memory elements, arranged by rows and columns. In particular, in the exemplary embodiment described herein, in the data retrieval mode the memory is seen as eight randomly accessible bidimensional memory blocks of sixty-four memory elements each: the first three bits of each input word RIN[1:6]-RIN[43:48] can be seen as a digital code specifying a row address, while the remaining three bits can be seen as a digital code specifying a column address.

The memory architecture according to an embodiment of the present invention allows implementing a memory which, at least in data retrieval, behaves exactly like a RAM, but like a FIFO memory can be made up of flip-flops and logic gates, and thus is not restricted by the available RAM technology, thereby ensuring high performance in terms of operating speed. Additionally, the current consumption of the proposed memory architecture is, on average, smaller than that of a RAM.

Although the present invention has been disclosed and described by way of some embodiments, it is apparent to those skilled in the art that several modifications to the described embodiments, as well as other embodiments of the present invention are possible without departing from the scope thereof.

For example, in the data retrieval mode the memory control unit may clock, and rotate, only one sub-array in each array, namely the sub-array which is selected for outputting the data, according to the address provided externally. In this way, the current consumption can be further reduced.

Also, it is not necessary that the tristate buffers be fed by the lowest memory element in each sub-array; any other memory element in the sub-array can be chosen as the output port of the sub-array.

In an alternative embodiment of the present invention, requiring slight changes to the circuitry described before, the memory may operate dually, and be equivalent to a pseudo-randomly accessible bidimensional memory in the data storage operating mode, and as a sequentially-accessible memory in the data retrieval operating mode.

What is claimed is:

1. A memory comprising:
   at least one array of memory elements;
   a partition of the at least one array into a plurality of sub-arrays of the memory elements;
   an array configuration circuit for selectively placing the at least one array in one of two operating configurations, the two operating configurations including:
     a first operating configuration, in which the memory elements of the at least one array are coupled one to another to form a monodimensional sequentially-accessible memory, and
     a second operating configuration, in which the memory elements in each sub-array are coupled to one another so as to form an independent monodimensional sequentially-accessible memory block, the memory blocks of each sub-array being isolated from the memory blocks of the other sub-arrays, and a data content of any memory element of the sub-array being rotatable by shifts through the memory elements of the sub-array;
   a sub-array selector, responsive to a first memory address, for selecting one among the plurality of sub-arrays according to the first memory address, the sub-array selector enabling access to the selected sub-array;
   a memory element access circuit, responsive to a second memory address, for enabling access to a prescribed memory element in the selected sub-array after a prescribed number of shifts, depending on the second memory address, of the data content of the memory elements in the selected sub-array;
   wherein the first operating configuration is a data storage configuration in which the memory is placed when data are to be stored therein; and
   wherein the second operating configuration is a data retrieval configuration in which the memory is placed when data are to be retrieved therefrom.

2. The memory according to claim 1, in which said array configuration circuit includes, for each sub-array of memory elements, an input selector associated with a first memory element of the sub-array, for selectively feeding the first memory element with either an output of a last memory element in an adjacent previous sub-array, in the first operating configuration, or an output of a last memory element of the sub-array, in the second operating configuration.

3. The memory according to claim 1, in which in the second operating configuration each sub-array provides a respective output data, the sub-array selector selecting one sub-array output data out of the output data provided by the plurality of sub-arrays, according to the first address.

4. The memory according to claim 3, in which said memory element access circuit enables a transfer of the output data of the selected sub-array to a memory output after a prescribed number of shifts of the data content of the memory elements in the selected sub-array.

5. The memory according to claim 4, in which said memory element access circuit includes a counter for counting the number of data content shifts, and a coincidence detector detecting coincidence between a counter value and a value representative of the second address, the coincidence detector enabling the transfer of the output data of the selected sub-array to the memory output when the counter value equals the value representative of the second address.

6. The memory according to claim 1, in which each memory element includes at least one flip-flop.

7. A memory, comprising:
   a plurality of memory locations; and
   a control circuit coupled to the memory locations and operable,
     during a read operation to configure the memory locations for random access only; and
     during a write operation to configure the memory locations for sequential access only.

8. The memory of claim 7 wherein the control circuit is operable during the write operation to configure the memory locations as a first-in-first-out storage location.

9. A memory, comprising:
   an array of memory locations; and
   a control circuit coupled to the array and operable to cause the array to operate as:
     a random-access memory during all read operations; and
     a first-in-first-out memory during all write operations;
   wherein the memory locations comprise rings of serially coupled memory locations each having a respective contents, with the contents of each ring being independent of the contents of the other rings; and
   wherein during the read first mode of operation, the control circuit is operable to control each of the rings:
     to receive a clock signal,
     to shift the contents of each respective memory location in the ring to a respective next memory location in the ring once per cycle of the clock signal, and
     to allow access to one of the memory locations during a predetermined cycle of the clock signal.

10. The memory of claim 9 wherein:
the memory locations comprise a ring of a number n of serially coupled memory locations each having a respective contents; and
during the read mode of operation, the control circuit is operable:
to receive a clock signal,
to shift the contents of each respective memory location in the ring to a respective next memory location in the ring once per cycle of the clock signal for n clock cycles, and
to allow access to a predetermined one of the memory locations during a predetermined cycle of the clock signal.

11. An electronic system, comprising:
a memory, comprising;
a plurality of memory location; and
a control circuit coupled to the memory locations and operable:
during a read operation to configure the memory locations for random access; and
during a write operation to configure the memory locations for sequential access via a single one of the memory locations only.

12. A method, comprising:
during one of a read mode and a write mode of operation, configuring memory locations of a memory for random access only; and
during the other of the read mode and the write mode of operation, configuring the memory locations for sequential access only.

13. The method of claim 12, further comprising, during the one of the read mode and the write mode of operation:
accessing a first memory location with a first address that corresponds to the first memory location; and
accessing a second memory location with a second address that corresponds to the second memory location.

14. The method of claim 12, further comprising:
wherein the other of the read mode and write mode of operation comprises the read mode of operation; and
during the read mode of operation:
reading first data from a first memory location;
shifting second data from a second memory location into the first memory location; and
reading the second data from the first memory location.

15. The method of claim 12, further comprising:
wherein the other of the read mode and write mode of operation comprises the write mode of operation; and
during the write mode of operation:
writing first data to a first memory location;
shifting the first data from the first memory location to a second memory location; and
writing second data to the first memory location.

16. The method of claim 12, further comprising, during the one of the read mode and the write mode of operation:
shifting the contents of each respective memory location to a respective next memory location a number of times; and
accessing a predetermined one of the memory locations after a predetermined one of the shifts.

17. The method of claim 12, further comprising, during the one of the read mode and the write mode of operation:
shifting the contents of each of n ones of the respective memory locations to a respective next one of the n memory locations n times; and
accessing a predetermined one of the n memory locations after a predetermined one of the n shifts.

* * * * *